United States Patent [19]

Scott et al.

[11] Patent Number: 5,012,245
[45] Date of Patent: Apr. 30, 1991

[54] INTEGRAL SWITCHED CAPACITOR FIR FILTER/DIGITAL-TO-ANALOG CONVERTER FOR SIGMA-DELTA ENCODED DIGITAL AUDIO

[75] Inventors: Jeffrey W. Scott, Temple; Thayamkulangara R. Viswanathan, Wyomissing, both of Pa.

[73] Assignee: AT&T Bell Laboratories, Murray Hill, N.J.

[21] Appl. No.: 417,219

[22] Filed: Oct. 4, 1989

[51] Int. Cl.$^5$ .............................................. H03M 1/66
[52] U.S. Cl. ....................................... 341/150; 341/144
[58] Field of Search ............... 341/118, 120, 121, 144, 341/150, 153, 154, 172

[56] References Cited

U.S. PATENT DOCUMENTS

| | | | |
|---|---|---|---|
| 4,380,756 | 4/1983 | Worsman | 341/172 X |
| 4,384,227 | 5/1983 | Allgood et al. | 341/150 |
| 4,384,276 | 5/1983 | Kelly et al. | 341/150 |
| 4,573,038 | 2/1986 | Carbrey | 341/172 X |
| 4,918,454 | 4/1990 | Early et al. | 341/150 X |

OTHER PUBLICATIONS

"A CMOS Stereo 16-bit D/A Converter for Digital Audio", by Peter J. A. Naus et al., *IEEE Journal of Solid-State Circuits*, pp. 391-395.

"A Use of Double Integration in Sigma Delta Modulation", by James C. Candy, *IEEE Transactions on Communications*, vol. COM-33, No. 3, Mar. 1985, pp. 249-358.

"A Novel Higher Order Interpolative Modulator Topology for High Resolution Oversampling A/D Converters", by Wai Laing Lee, Bachelor and Master Thesis, Massachusetts Institute of Technology, Jun. 1987.

*Adaptive Signal Processing*, by Widrow and Stearns, 1985 by Prentice-Hall, Inc., Englewood Cliffs, N.J. 07632.

"Switched-Capacitor Realization of FIR Filters", *IS-CAS'84*, N. Sridhar Reddy and M. N. S. Swamy, pp. 69-72, 1984, IEEE.

"Oversampling A-to-D and D-to-A Converters with Multistage Noise Shaping Modulators", *IEEE Transactions on Acoustics, Speech, and Signal Processing*, vol. 36, No. 12, Dec. 1988, K. Uchimura, T. Hayashi, T. Kimura, A. Iwata, pp. 1899-1905.

"A 17-bit Oversampling D-to-A Conversion Technology Using Multistage Noise Shaping", *IEEE Journal of Solid-State Circuits*, vol. 24, No. 4, Aug. 1989, Y. Matsuya, K. Uchimura, A. Iwata, T. Kaneko, pp. 969-975.

"Oversampled, Linear Predictive and Noise-Shaping Coders of Order N>1", *IEEE Transactions on Circuits and Systems*, vol. CAS-25, No. 7, Jul. 1978, S. K. Tewksbury, R. W. Hallock, pp. 436-447.

"Design and Implementation of an Audio 18-Bit Analog-to-Digital Converter Using Oversampling Techniques", *J. Audio Eng. Soc.*, vol. 34, No. 3, Mar. 1986, pp. 153-166.

Primary Examiner—A. D. Pellinen
Assistant Examiner—Brian K. Young
Attorney, Agent, or Firm—S. W. McLellan

[57] ABSTRACT

A combined finite impulse response filter and digital-to-analog converter for converting sigma-delta over-sampled data into analog form. The filter removes out-of-band noise energy from the reconstructed analog signal resulting from the sigma-delta encoding process. The filter/converter is implemented in switched-capacitor technology. Further, a method of designing the optimum number of taps and the tap weight coefficients of the filter is given.

9 Claims, 4 Drawing Sheets

INTEGRAL SWITCHED CAPACITOR FIR FILTER/DIGITAL-TO-ANALOG CONVERTER FOR SIGMA-DELTA ENCODED DIGITAL AUDIO

CROSS-REFERENCE TO RELATED APPLICATION

BACKGROUND OF THE INVENTION

This application is related to a co-pending patent application titled "TECHNIQUE FOR COMPENSATING SWITCHED CAPACITOR CIRCUITS HAVING GAIN-SETTING RESISTORS", by J. W. Scott, et al., Ser. No. 416,888, filed simultaneously with, and assigned to the same assignee as, this application.

FIELD OF THE INVENTION

This invention relates to digital signal processing in general and, more particularly, to switched-capacitor digital-to-analog converters and finite impulse response filters.

DESCRIPTION OF THE PRIOR ART

Digital audio applications, such as compact disks (CD) and digital audio tapes (DAT), require very high precision digital-to-analog converters (DAC) as part of the reproduction equipment. The more the bits the DAC can accept with linearity and monotonicity, the greater the dynamic range the reproduction equipment can have. Conventional DACs convert the analog signal from the digital data in parallel, i.e., all or substantial portions of the bits comprising the digital representation of an analog signal sample are used substantially simultaneously to recreate the analog signal sample. However, making a conventional DAC using 14 or more bits is difficult to do for low cost consumer applications and still achieve the desired linearity and monotonicity.

To overcome these limitations, oversampling techniques were developed such that a DAC using only a few bits at a time (typically one), at a very high data rate, can achieve a performance level equivalent to a 16 bit DAC. See "A CMOS Stereo 16-bit D/A converter for Digital Audio", by P. J. A. Naus, et al., *IEEE Journal of Solid-State Circuits*, Vol. SC-33, No. 3, June 1987, pp. 390–5.

A drawback to oversampling is the amount of noise introduced by a portion of the oversampling process which converts the parallel digital data into a single, high rate, digital bit stream. The circuit that does the conversion is called a delta-sigma ($\Delta\Sigma$) encoder, also referred to as a noise-shaper or interpolative modulator. To reduce the noise, the encoder has many stages (referred to as the order thereof), typically two or more. The higher the order, the lower and more random the noise. An example of a second order encoder is given in "A Use of Double Integration in Sigma Delta Modulation", by J. C. Candy, *IEEE Transactions on Communications*, Vol. COM-33, No. 3, Mar. 1985, pp. 249–58. Recently, a fourth order oversampling encoder has been proposed; see "A Novel Higher Order Interpolative Modulator Topology for High Resolution Oversampling A/D Converters", by Wai Laing Lee, Bachelor and Master thesis, Massachusetts Institute of Technology, June 1987. Such encoders allow for even greater dynamic range than previously possible, such that 18 bit equivalent resolution may be achieved.

However, even with the higher order oversampling encoders, sufficient noise is present above the desired analog passband (here the audio band of frequencies, approximately 20 to 20,000 Hz), along with aliased signals that simple lowpass filters cannot effectively remove. This allows for undesired out-of-band signals to be amplified by subsequent linear amplifiers, increasing the distortion therefrom.

SUMMARY OF THE INVENTION

It is therefore one aspect of the invention to provide an integrated filter/DAC for oversampled digital data that reduces the out-of-band noise to achieve lower distortion.

It is another aspect of the invention to provide this integrated filter/DAC in a compact form amenable to fabrications as an integrated circuit.

It is still another aspect of the invention to provide a procedure for designing the filter portion of the integrated filter/DAC that substantially optimizes the filter's characteristics automatically with any kind of oversampling ($\Delta$-$\Sigma$) encoder.

These and other aspects of the invention are provided for generally by a circuit for converting single bit digital input data into analog form, characterized by: a shift register, having multiple taps, for shifting the digital input data; a plurality of signal capacitors, corresponding to the taps on the shift register, each signal capacitor having a predetermined capacitance and one end coupling to a summing node; and, a plurality of first switch means, corresponding to the plurality of signal capacitors and responding to the corresponding tap on the shift register, for selectively coupling one of two voltage references to the other end of the signal capacitors depending on the state of the corresponding tap of the shift register and the state of a clock signal; wherein signals on the summing node are analog signals corresponding to the digital input data and the capacitances of the signal capacitors represent corresponding tap weight coefficients of a finite impulse response filter.

These aspects of the invention are also provided for generally by a method of converting single bit digital input data into analog form, characterized by the steps of: shifting the digital input data with a multiple tap shift register; summing to a summing node charge from a plurality of signal capacitors, corresponding to the taps on the shift register, each signal capacitor having a predetermined capacitance; and, selectively coupling the signal capacitors to one of two voltage references depending on the state of the corresponding tap of the shift register and the state of a clock signal; wherein signals on the summing node are analog signals corresponding to the digital input data and the capacitances of the signal capacitors represent corresponding tap weight coefficients of a finite impulse response filter.

Still further, these aspects of the invention are also provided for generally by a method of determining the number of taps and the tap weight coefficients in a filter adapted to filter over-sampled data, characterized by the steps of: generating a digital data stream from an encoder, used to encode the over-sampled data, with no signal input; generating a sampled signal representing the passband of the desired filter, combining the digital data stream and the sampled signal; filtering the combined digital data stream and the sampled signal by the filter; subtracting the output of the filter from a delayed version of the sampled signal to form an error signal, the amount of delay being substantially the same as the delay of the sampled signal through the filter; and adjusting the number taps and the tap weight coefficients of the filter to reduce the error signal.

BRIEF DESCRIPTION OF THE DRAWING

The foregoing features of this invention, as well as the invention itself, may be more fully understood from the following detailed description of the drawings, in which.

DETAILED DESCRIPTION

Figure 1:
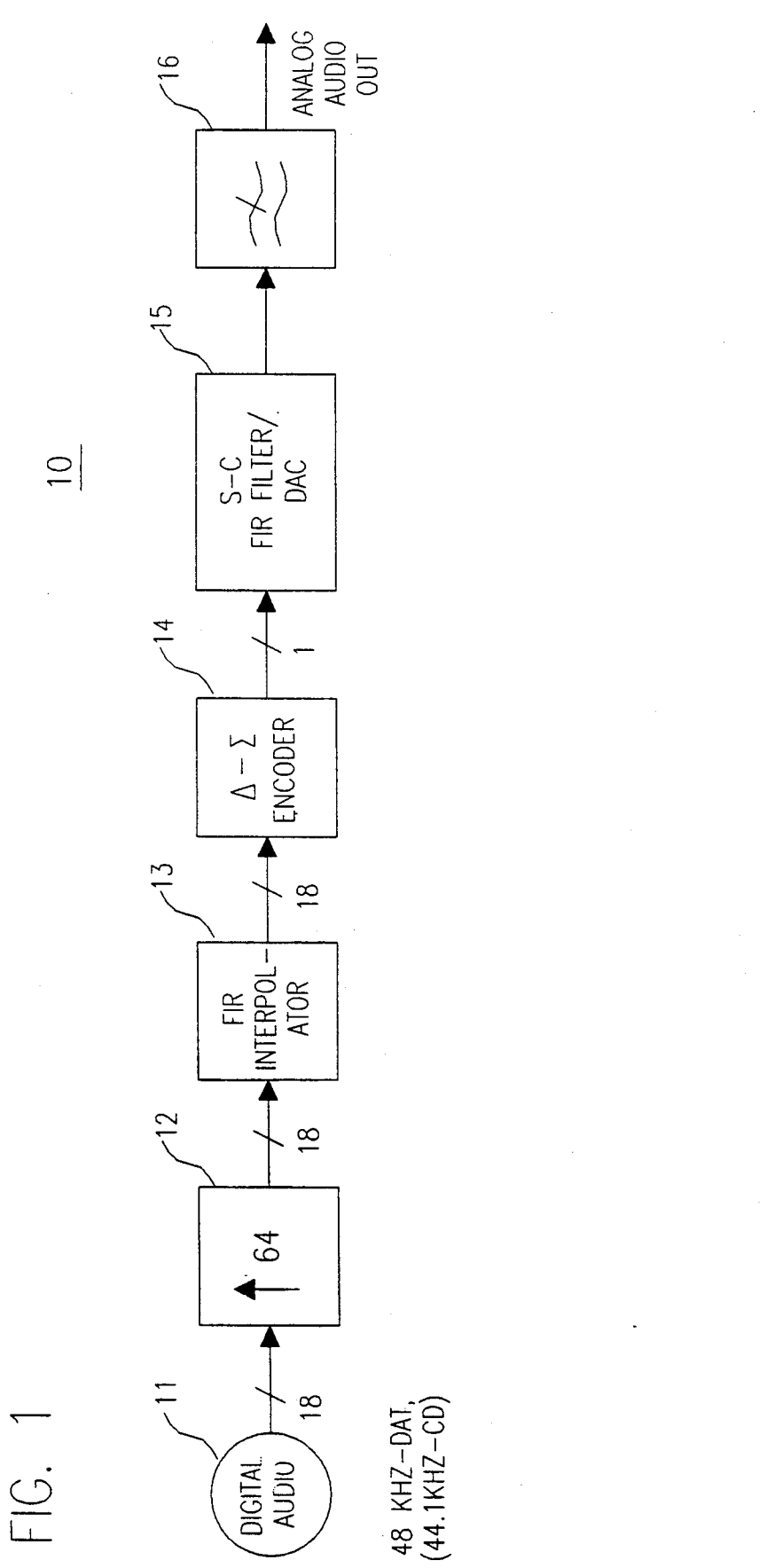
FIG. 1 is a diagram of an exemplary digital audio converter, using oversampled data techniques, for compact disk or digital audio tape applications.

In FIG. 1, a block diagram of an exemplary digital audio converter 10 taking eighteen bit parallel digital data words from a source 11, such as a digital audio tape (DAT) or a compact disk (CD), and converting it into an analog output, here an audio signal. By convention, the data rate is 48 KHz (the number of eighteen bit digital data words per second) for DAT and 44.1 KHz for CDs. This data stream is fed to a sixty-four times oversampler 12 and then to a finite impulse response (FIR) interpolator 13 to increase the data rate and smooth out the sixty-four samples between the samples from the source 11. The oversampled and interpolated eighteen bit data, at rates of 3.072 MHz for DAT and 2.8224 MHz for CD, are applied to the ($\Delta$-$\Sigma$) encoder 14, such as the second order or fourth order encoders discussed above. The output thereof is a single bit stream of the same frequency as the input data to the encoder 14, i.e., 3.072 or 2.8224 MHz for DAT or CD, respectively. The ($\Delta$-$\Sigma$) encoded and oversampled digital bit stream is then applied to a combined switched capacitor finite impulse response filter and digital-to-analog converter 15 (FIR/DAC), the details of which will be discussed below. The resulting analog signal is then passed though a lowpass filter 16 to remove any clock and aliased signal energy from the digital-to-analog conversion process by the FIR/DAC 15.

Figure 2:
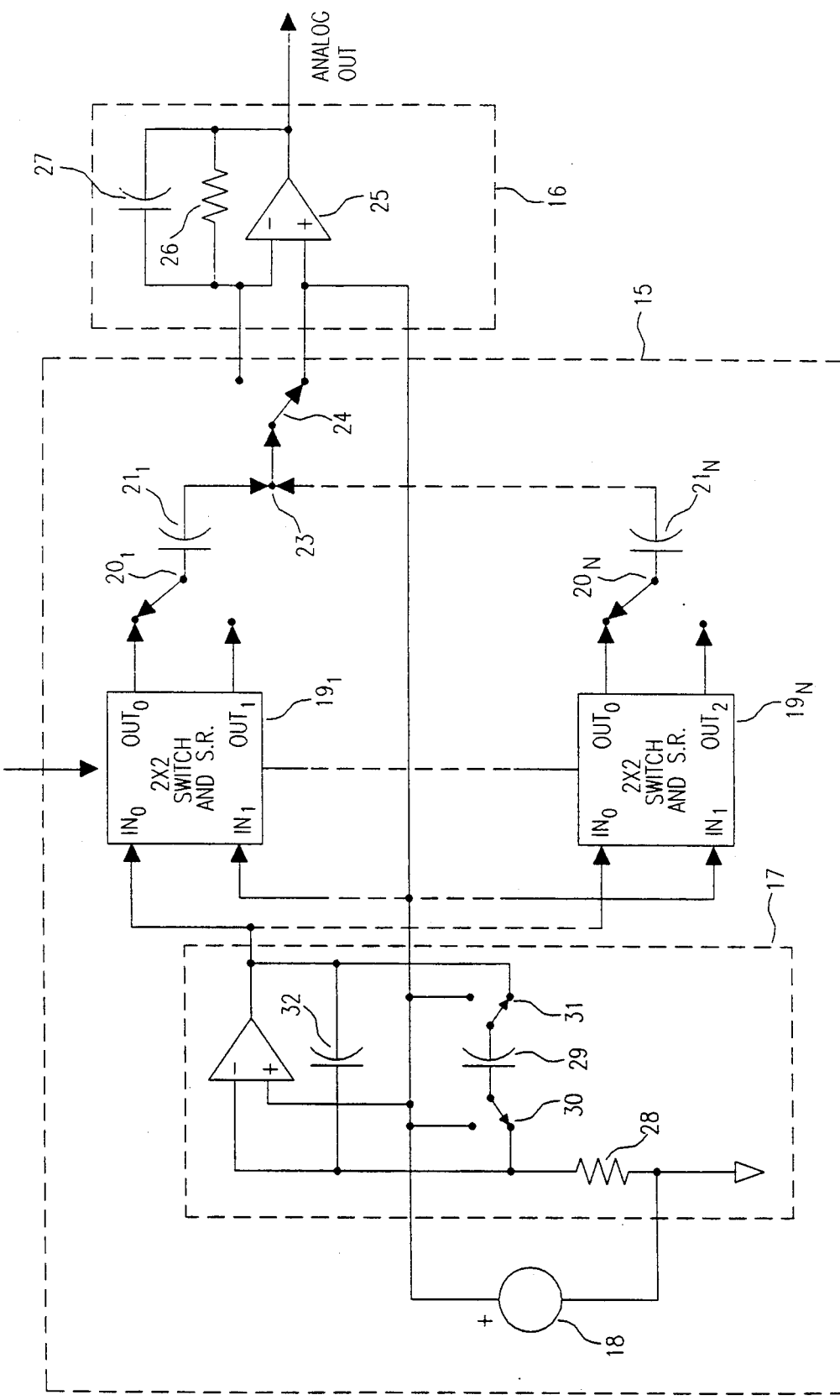
FIG. 2 is a schematic diagram of the switched-capacitor FIR filter and DAC shown in FIG. 1.

In FIG. 2, the FIR/DAC 15 and the lowpass filter 16 are shown in simplified schematic form. As is well known in switched capacitor technology and will not be discussed here, non-overlapping clock signals (not shown) control switches $20_1$-$20_N$, 24, 30, and 31. The frequency $f_c$ of the clock signal is the same as the ($\Delta$-$\Sigma$) encoded and oversampled digital data rate to the FIR/DAC 15. It is also well known, and will not be discussed in detail here, that switched capacitors synthesize resistors, the amount of equivalent "resistance" being dependent on the switching frequency and the capacitance (C) of the capacitor. For purposes here, that amount of "resistance" is approximately $1/f_c C$.

The FIR/DAC 15 includes two voltage references 17, 18, the 2×2 switches with a corresponding shift register (S.R.) tap $19_1$-$19_N$ ($N \geq 1$), 2:1 switches $20_1$-$20_N$, and signal capacitors $21_1$-$21_N$ coupling to summing node 23. The 2×2 switches $19_1$-$19_N$ and 2:1 switches $20_1$-$20_N$ selectively couple the corresponding signal capacitors $21_1$-$21_N$ to either one of the two voltage references 17, 18 in response to the state of the corresponding tap on the shift register (formed by the serial cascading of flip-flops (not shown) within $19_1$-$19_N$ and discussed below) in combination with the state of the clock signal. The capacitances of signal capacitors $21_1$-$21_N$, corresponding to the tap weight coefficients of the FIR filter, are chosen such that the desired FIR filter response is achieved while performing the DAC function on the ($\Delta$-$\Sigma$) encoded and oversampled digital input data. Analog signals from the combined FIR filtering and DAC process are summed to the summing node 23 and fed through switch 24 to lowpass filter 16. Filter 16, including a signal operational amplifier 25, has the gain thereof set by resistor 26 and a cutoff frequency determined by capacitor 27. Resistor 26 is preferably used instead of another switched capacitor for precise control over the gain of the digital-to-analog conversion process and to avoid harmonic distortion caused by signal dependent clock-feed through, i.e., clock energy which is dependent on the desired signal amplitude. Capacitor 27 is chosen so that the filter 16 attenuates any residual clock signal and aliased signals from the analog output of the FIR/DAC 15 while passing unmolested the desired analog signals.

In more detail, the FIR/DAC 15 has a first voltage reference 17 and a second voltage reference 18 which drive N 2×2 switches $19_1$-$19_N$. Operation of the two voltage references and their advantages are explained in detail in the above-referenced patent application titled "TECHNIQUE FOR COMPENSATING SWITCHED CAPACITOR CIRCUITS WITH GAIN-SETTING RESISTORS". A brief description of the references and their function is presented herein.

The voltage reference 18, a conventional fixed voltage source, supplies a fixed bias voltage while having substantially zero impedance for AC signals. The reference 18, for example, is a bandgap derived voltage reference which provides the necessary bias voltage to the lowpass filter 16 and other circuitry (not shown). The output voltage of the reference 18 is typically near one-half the voltage difference between power supply voltages (not shown) to the digital audio converter 10 (FIG. 1), such as two volts for a five volt power supply, the other power supply being substantially zero volts. The voltage reference 17 is dependent on the voltage from reference 18 and is varied in response to the resistance of resistor 28 in combination with the equivalent resistance of switched capacitor 29. It is sufficient to state here that the output voltage from reference 17 varies with the capacitance of capacitor 29 to compensate for variations in the overall gain of the FIR/DAC 15 due to variations in the total capacitance of signal capacitors $21_1$-$21_N$. The resistance of resistor 28, used to externally set the voltage of reference 17, is substantially invariant compared to the capacitance of capacitor 29. The variations in the total capacitance of signal capacitors $21_1$-$21_N$ results from large fabrication tolerances in the physical size of the capacitors $21_1$-$21_N$, compared to the relatively tight tolerances of resistors, such as resistor 26 in the lowpass filter 16. However, the relative capacitances of capacitors $21_1$-$21_N$ are substantially consistent from one integrated circuit to another. These variations in capacitance are matched by capacitor 29 since they are on the same integrated circuit. It is noted that the voltage difference between the references 17 and 18 determine the overall amplitude of the analog output signal from the FIR/DAC 15 and, ultimately, from the lowpass filter 16. Thus, the variations in analog signal from the FIR/DAC 15 are compensated by the changes in the voltage difference between the references 17 and 18 instead of by varying the gain of the lowpass filter 16. Note that the FIR filter characteristics are not changed as a result of changing the voltage difference between the references 17 and 18.

As stated above, the switches 30, 31 are controlled by the clock signal (not shown). Capacitor 32 may be added to reference 17 to reduce any noise generated by the switching of capacitor 29 from entering the 2×2 switches $19_1$–$19_N$ and corrupting the filtering and digital-to-analog conversion processes.

Figure 3:
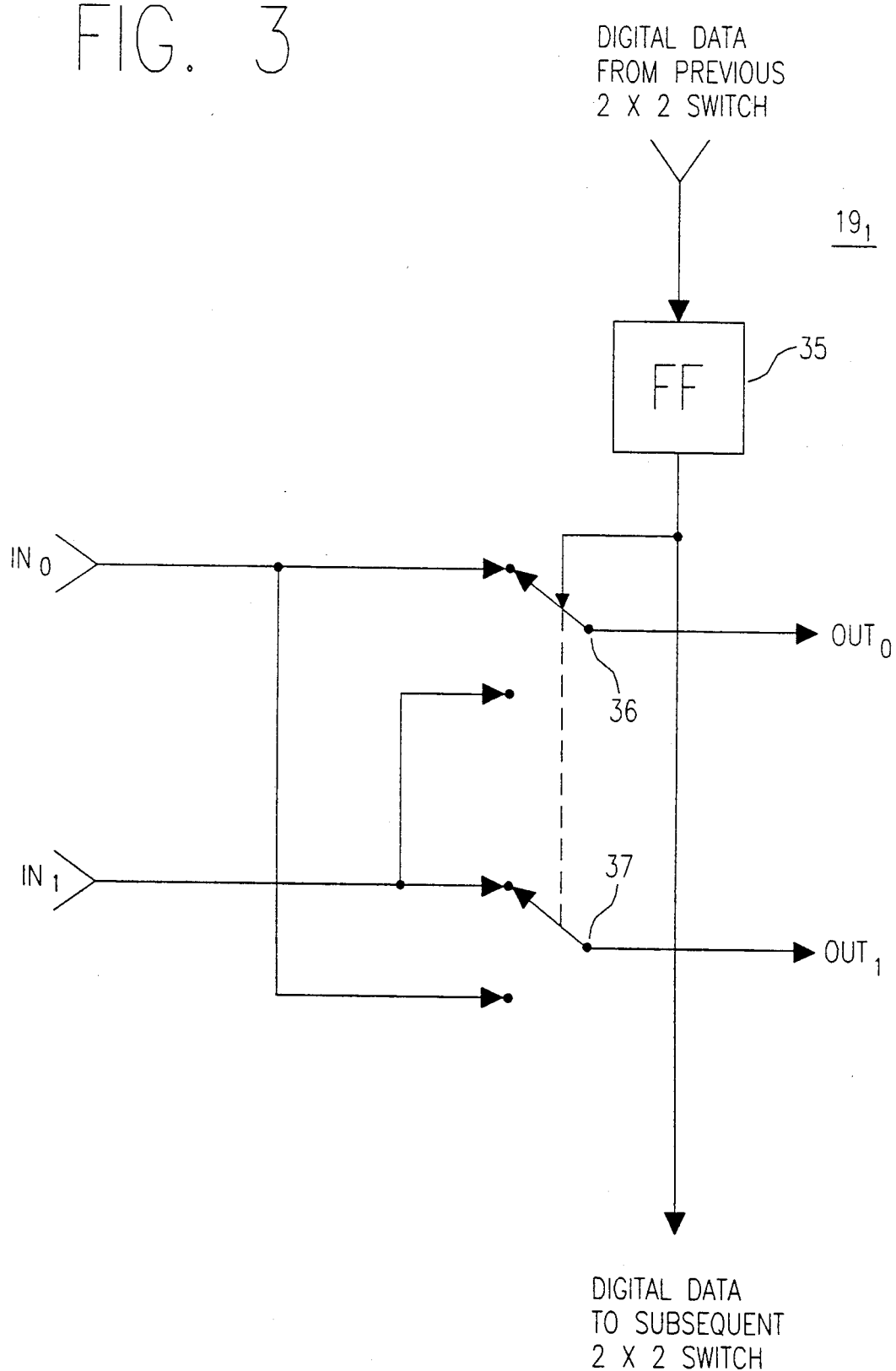
FIG. 3 is a simplified diagram of the 2×2 switch shown in FIG. 2.

As stated above, each of the 2×2 switches $19_1$–$19_N$ includes a shift register tap. In FIG. 3, an exemplary one of the 2×2 switches $19_1$ is diagrammed. Flip-flop 35 serves as a stage in the shift register comprised by serially coupling (cascading) the flip-flops 35. Output from the flip-flop 35, referred to here as a shift register tap, controls exemplary 2:1 switches 36, 37 to perform the 2×2 switch function. As shown, depending on the state of flip-flop 35, the switches 36, 37 may pass signals on the inputs $In_0$, $In_1$ to outputs $Out_0$, $Out_1$ directly- or cross-coupled. It is noted that this embodiment is for illustrative purposes only; there are many configurations which will achieve the desired 2×2 switch function.

Returning to FIG. 2, the capacitances of capacitors $20_1$–$20_N$, corresponding to the tap weight coefficients of the FIR filter portion, determines the FIR filter response and the gain of the digital-to-analog conversion process in FIR/DAC 15. It has been found that the tap weight coefficients for the FIR filter are difficult to determine when using (Δ-Σ) encoders 14 (FIG. 1) due to a substantially non-linear process therein and that the output thereof is not zero when zero input is applied. Therefore, empirical methods are preferred to select the tap weight coefficients. The standard method of doing this, such as that shown in FIG. 10.1 of *Adaptive Signal Processing*, by B. Widrow and S. D. Stearns, Prentice-Hall, 1985, involves stimulating the (Δ-Σ) encoder 14 (the "plant" in FIG. 10.1 of Widrow and Stearns) with sinusoids in the desired frequency bands (passband) of interest. The FIR filter used would then have the taps weight coefficients adjusted to minimize the difference between the output of the FIR filter (after the digital-to-analog conversion) and the input sinusoids. However, it has been found that this does not produce the optimum coefficients; the resulting residual noise from the FIR filter, when no signal to the (Δ-Σ) encoder 14 is present, is greater than the theoretical noise level that may be achieved.

Therefore, a new method of designing the tap weight coefficients presented herein improves the output noise level of the converter 10. It must first be recognized that the digital bit stream from a (Δ-Σ) encoder 14 is power limited. In addition, the amount of noise power in the digital bit stream decreases with increasing signal power. This trade-off is most evident when no signal (zero signal) is presented to the input of the (Δ-Σ) encoder 14; the output is a nearly random bit stream consisting of noise.

Figure 4:
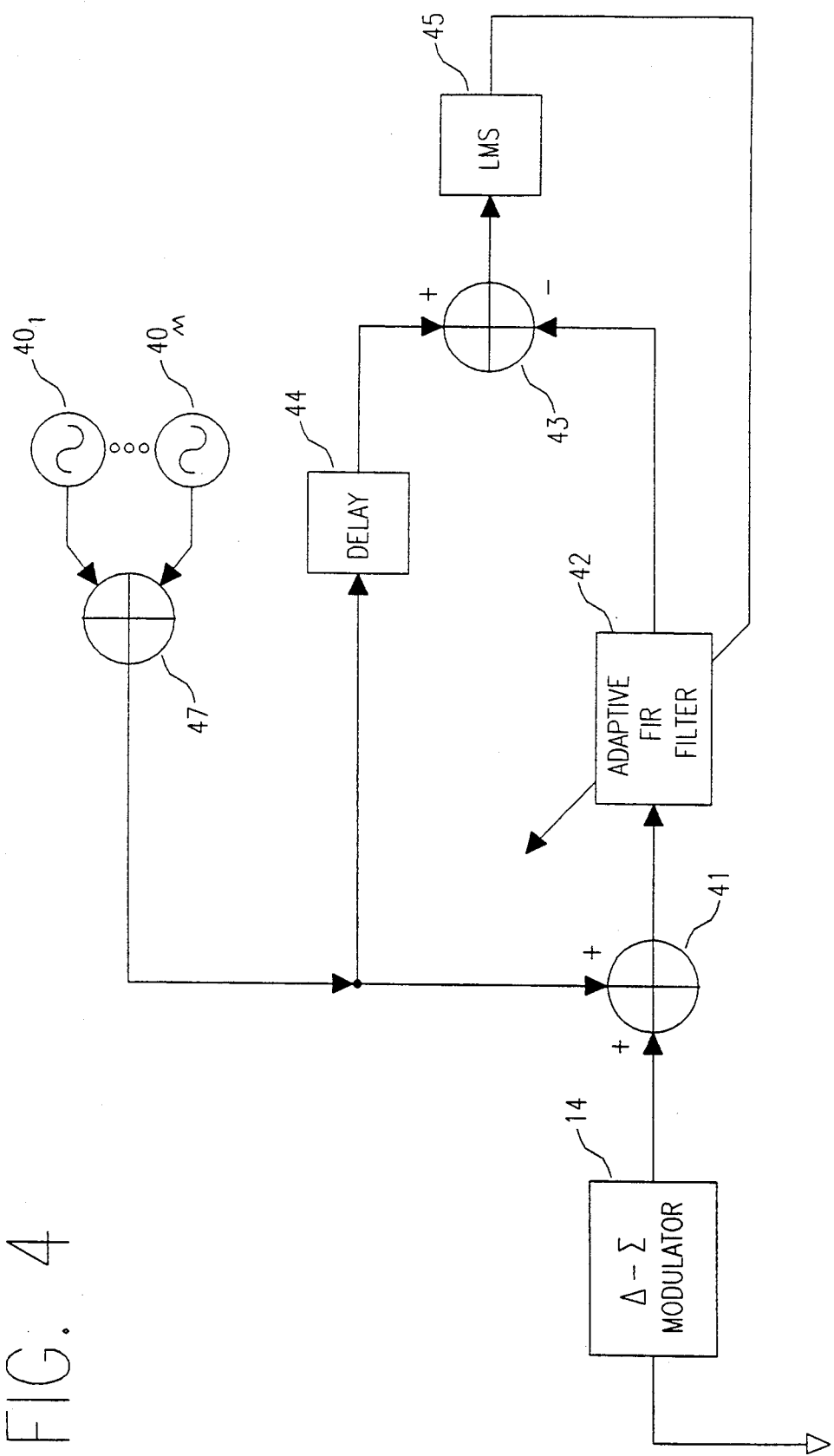
FIG. 4 is a representative diagram of the preferred method of determining the tap weight coefficients for the FIR filter portion of the combined switched capacitor FIR filter and DAC shown in FIG. 2.

The preferred method of determining the tap weight coefficients in a filter used to filter (Δ-Σ) encoded digital data is shown in FIG. 4. Here, the input to the (Δ-Σ) encoder 14 used in FIG. 1 is forced to zero, the no signal case. The bit stream therefrom is added to sampled signals from sample generators $40_1$–$40_M$ ($M \leq 1$), representing signals, such as sinusoids, in the desired passband of the converter 10 (FIG. 1), in adder 41. The sample rate of the sampled signals from generator $40_1$–$40_M$ are at the same rate as the bit stream. The sum of the digital bit stream and the sampled signals are applied to the FIR filter 42. Note that the FIR filter 42 is similar to the FIR/DAC of FIG. 2 except the function of the DAC is not used. Further, the tap weight coefficients (corresponding to the capacitances of signal capacitors $21_1$–$21_N$ in FIG. 2) are variable for purposes that will be evident below.

The filter 42 output is then passed to a subtracter 43 for comparison to the delayed sampled signals from delay 44. Note that the delay from delay 44 is substantially the same as the delay provided by the filter 42 to the sampled signals so that meaningful comparisons can be made. The comparison by subtracter 43 indicates the degree of error between the filtered sampled signals with the digital bit stream and the sampled signals (delayed) themselves. The better the filtering process, the smaller the error. The error signal is fed back to the FIR filter 42 to suitably adapt the tap weight coefficients therein. The preferred method of minimizing the error is by applying the least mean squares (LMS) algorithm 45 to the error signal from subtracter 43. The LMS algorithm is described in detail on pages 99–102 of the Widrow and Stearns text. However, other algorithms may be used to minimize the error, such as the sequential regression (SER) and the LMS/Newton algorithms.

It is preferable that the sampled signal from generators $40_1$–$40_M$ ($M \geq 1$) be sampled sinusoids and combined by summer 47. The generators $40_1$–$40_M$ should have frequencies spanning the entire desired passband, such as 20 Hz to 20 KHz for digital audio applications.

It is preferable to model the system shown in FIG. 4 in a computer than building a physical embodiment, the output of which would be the tap weight coefficients for the FIR/DAC 15 of FIG. 1.

This design method may be applied to any filter 42 instead of just a FIR type filter. However, FIR filters (no feedback is used therein) can have a linear phase response which makes determining the amount of delay from delay 44 predictable, depending on the number of taps in the FIR filter. Infinite impulse response (IIR) filters may be used, but the feedback in the implementation thereof complicates the delay and LMS functions.

Having described the preferred embodiment of this invention, it will now be apparent to one of skill in the art that other embodiments incorporating its concept may be used. It is felt, therefore, that this invention should not be limited to the disclosed embodiment, but rather should be limited only by the spirit and scope of the appended claims.

We claim:

1. In an integrated circuit, a circuit for converting single bit digital input data into analog form, characterized by:

a shift register, having N-taps, for shifting the digital input data;

a plurality of signal capacitors, corresponding to the taps on the shift register, each signal capacitor having a predetermined capacitance and one end coupling to a summing node; and, a 2×2 switch, responsive to the corresponding tap on the shift register, having two inputs for selectively coupling one of two voltage references to the other end of the signal capacitors depending on the state of the corresponding tap of the shift register and two outputs;

a 2:1 switch for coupling the corresponding one of the plurality of signal capacitors to either of the outputs of the 2×2 switch in response to the state of a clock signal;

wherein signals on the summing node are analog signals corresponding to the digital input data and the capacitances of the signal capacitors represent corresponding tap weight coefficients of a finite impulse response filter.

2. The circuit as recited in claim 1, further characterized by:

an inverting low-pass filter with a virtual ground input, referenced to a third voltage reference, and an output; and, a switch means for alternately coupling the summing node to the virtual ground input of the inverting low-pass filter and to the third voltage reference in response to the clock signal;

wherein the analog output of the circuit is the output of the inverting low-pass filter.

3. The circuit as recited in claim 2, wherein the voltage of the third voltage reference is substantially the same as the voltage of the second voltage reference.

4. A method of converting single bit digital input data into analog form characterized by the steps of:

shifting the digital input data with a multiple tap shift register;

summing to a summing node charge from a plurality of signal capacitors, corresponding to the taps on the shift register, each signal capacitor having a predetermined capacitance; and, switching with a 2×2 switch, in response to the corresponding tap of the shift register, one of two voltage references between two outputs of the 2×2 switch depending on the state of the corresponding tap of the shift register; and, switching the corresponding signal capacitor between the two outputs of the 2×2 switch in response to a clock signal;

wherein signals on the summing node are analog signals corresponding to the digital input data and the capacitances of the signal capacitors represent corresponding tap weight coefficients of a finite impulse response filter.

5. The method as recited in claim 4, further comprising the step of: filtering the signals on the summing node with a low-pass filter.

6. A method of determining the number of taps and the tap weight coefficients in a filter adapted to filter over-sampled data, characterized by the steps of:

generating a digital data stream from an encoder, used to encode the over-sampled data, with no signal input;

generating a sampled signal representing the passband of the desired filter;

combining the digital data stream and the sampled signal;

filtering the combined digital data stream and the sampled signal by the filter;

subtracting the output of the filter from a delayed version of the sampled signal to form an error signal, the amount of delay being substantially the same as the delay through the filter; and, adjusting the number of taps and the tap weight coefficients of the filter to reduce the error signal.

7. The method as recited in claim 6, wherein the step of generating a sampled signal is further characterized by the steps of:

generating a plurality of sampled sinusoids, the frequencies of which are within the desired passband of the filter, and, combining the sampled sinusoids to create the sampled signal.

8. The method as recited in claim 7, wherein the step of adjusting the number of taps and the tap weight coefficients uses the least-mean-squares minimization process.

9. The method as recited in claim 8, wherein the filter is a finite impulse response filter.

* * * * *